(12) United States Patent
Shibata

(10) Patent No.: US 6,519,726 B1
(45) Date of Patent: Feb. 11, 2003

(54) SEMICONDUCTOR DEVICE AND TESTING METHOD OF THE SAME

(75) Inventor: Kayoko Shibata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/461,200

(22) Filed: Dec. 15, 1999

(30) Foreign Application Priority Data

Dec. 15, 1998 (JP) ............................................. 10-355705

(51) Int. Cl.⁷ .............................................. G11C 29/00
(52) U.S. Cl. ...................................... 714/718; 714/733
(58) Field of Search ................................ 714/718, 719, 714/720, 733; 365/201, 230.06

(56) References Cited

U.S. PATENT DOCUMENTS

| | | | | |
|---|---|---|---|---|
| 4,701,919 A | * | 10/1987 | Naitoh et al. | 714/718 |
| 5,400,342 A | * | 3/1995 | Matsumura et al. | 714/719 |
| 5,490,115 A | * | 2/1996 | Shah et al. | 365/201 |
| 5,896,342 A | * | 4/1999 | Nakao | 365/230.06 |
| 6,041,002 A | * | 3/2000 | Maejima | 365/201 |

FOREIGN PATENT DOCUMENTS

| | | |
|---|---|---|
| JP | 63-191400 | 8/1988 |
| JP | 5-249196 | 9/1993 |
| JP | 5-250898 | 9/1993 |
| JP | 5-342900 | 12/1993 |
| JP | 6-267294 | 9/1994 |

* cited by examiner

Primary Examiner—David Ton
(74) Attorney, Agent, or Firm—Young & Thompson

(57) ABSTRACT

A semiconductor device for testing highly integrated semiconductor devices in a compression mode by using a simple circuit and a specific physical pattern without using address data. The semiconductor device contains memory cell arrays and a device for selecting a test pattern input terminal which selects where a test pattern is to be input from among plural lines selected from bit lines and word lines, and a further device for generating a physical pattern which is constructed so that certain data is inputted in the lines selected to receive the test pattern, and so that the data is simultaneously outputted to data buses connected to plural lines other than the selected lines.

19 Claims, 11 Drawing Sheets

FIRST STEP CIRCUIT 1

FIRST STEP CIRCUIT 2

FIG.11

| I/O0 | T | N | N | T | T | N | N | T |
|---|---|---|---|---|---|---|---|---|
| I/O1 | N | N | T | T | N | N | T | T |
| I/O2 | T | N | N | T | T | N | N | T |
| I/O3 | N | N | T | T | N | N | T | T |
| WORD | 0 | 1 | 2 | 3 | 4 | 5 | 6 | 7 |

FIG.12

| I/O0 | H | H | H | H | H | H | H | H |
|---|---|---|---|---|---|---|---|---|
| I/O1 | L | H | L | H | L | H | L | H |
| I/O2 | H | H | H | H | H | H | H | H |
| I/O3 | L | H | L | H | L | H | L | H |
| WORD | 0 | 1 | 2 | 3 | 4 | 5 | 6 | 7 |

FIG.13

| I/O0 | H | H | H | H | H | H | H | H |
|---|---|---|---|---|---|---|---|---|
| I/O1 | H | H | H | H | H | H | H | H |
| I/O2 | H | H | H | H | H | H | H | H |
| I/O3 | H | H | H | H | H | H | H | H |
| WORD | 0 | 1 | 2 | 3 | 4 | 5 | 6 | 7 |

SEMICONDUCTOR DEVICE AND TESTING METHOD OF THE SAME

FIELD OF THE INVENTION

The present invention relates to a semiconductor device and a testing method of the same, and more particularly, relates to a semiconductor device composed of large scale integration type memory cell array and a testing method of the same capable of carrying out a testing effectively.

BACKGROUND OF THE INVENTION

As a level of integration in semiconductor devices including a memory device has improved, a testing time of the semiconductor device has increased. Accordingly, one of the important problems to be solved in the development of semiconductor devices is how the testing time of the semiconductor device can be reduced.

Namely, as high integration of semiconductor device is achieved, it is required that various testing methods are effectively conducted to obtain reliable test data in short time. Examples of the testing methods are insulation failure, current leakage, burn-in test to check presence of parasite volume or parasite transistor and hold test to confirm a refresh cycle.

As the methods, it is developed, for example, that circuit construction is built in the semiconductor device, or that the circuit construction is provided in external and peripheral parts of the semiconductor device. The above problem causes in such products that a plurality of cell data is selected by one column address and is assigned to input/output means (I/O) different from each other, because bit map is complicated in a large scale integrated semiconductor device generally called as CPF type memory cell array of which example is shown in FIG. 8.

For example, when the HOLD test to disturb a cell is done, a pattern worse to the observing cell is written in the cell. It is different from each other by a sort of disturbance to be applied and is generally called as physical pattern because it is the pattern written based on physical consideration without any relation to address order. That is, the physical pattern means, where semiconductor device is tested, a predetermined pattern to be written in specific cell of the semiconductor device for obtaining testing data.

A product using a semiconductor device which has thirty-two or sixteen of an output/input terminals is tested in a test mode called as I/O compression in its wafer test or burn-in test. According to the test mode, read-out and write-in is carried out by using one or several units of the input/output terminals selected from thirty-two or sixteen of I/O pins which are input/output means of semiconductor device to be tested.

In other words, instead of the conventional test method that all of input/output means (i.e. I/O pins) are used to check output to input, the test mode includes selecting one or several I/O pins from a plurality of the I/O pins and inputting certain test data into the selected I/O pin(s) to check its output conditions, whereby it is decided if product quality of the semiconductor is satisfied with the predetermined standard.

In more detail, the predetermined test data is input in only one I/O pin to output the predetermined data in each of plural bit lines (write buses, WBST), simultaneously. That is, the output conditions of plural bit lines corresponding to the I/O pins other than the one I/O pin are simultaneously tested by using one of the I/O pins.

If the number of the input/output terminals (i.e. I/O pins) is reduced, the limited number of the I/O pins provided in the test board to be used in the testing operation can be assigned to more tips, and therefore, the method is essential in the field, because more tips can be checked at a time and test efficiency is more effective. In the above compression test mode, for example, if only one input/output terminal is selected and "11" data is written in the terminal, the situation at the time is same as that "1" data is written in the other I/O terminals not to be selected.

Accordingly, such the test method is generally called compression test method. A method for writing the physical pattern is, for example, disclosed in Japanese Patent Application Laid-Open No. 9-147597(147597/1997). According to the conventional method, certain cell is selected by using an address information, because cell data existed in certain address position of memory arrays in semiconductor device is inverted.

However, there are disadvantages in the conventional method that load becomes more and calculation processing speed is lowered, because the address signal is used.

Also, the technology that the cell is selected by using the address information is disclosed in Japanese Patent Application Laid-Open Nos. 5-249196(249196/1993) and 10172298(172298/1998), but there is same problems as above.

It is disclosed in Japanese Patent Application Laid-Open No. 7-12900(12900/1995) that a test pattern generating unit and an exclusive pattern generating unit which generates an address for writing test results to fail memory are disposed independent of semiconductor device to be tested. However, the operations are complicated because the units are disposed separate from the semiconductor device to be tested and are reconnected with the semiconductor device at every time when the semiconductor device to be tested is changed, and the same problem as above also exists.

On the other hand, an indication method of fail bit map is disclosed in Japanese Patent Application Laid-Open No. 9-91999(91999/1997), but such technology that circuit construction capable of writing particular physical pattern without using address information in semiconductor device to be tested is not disclosed.

SUMMARY OF THE INVENTION

Therefore, it is an object of the invention to provide an improved semiconductor device in which simple circuit construction is incorporated.

It is another object of the invention to provide construction of high integration type semiconductor device using particular physical pattern without address data, by which memory cell arrays are accurately and effectively tested in short time.

It is a still another object of the invention to provide a testing method of the semiconductor device capable of checking the memory cell arrays in compression mode for a short time, accurately and effectively.

The present invention provides a circuit and method for converting write data generated by the write data bus, considering the polarity of each memory cell, when the write data applied to one input terminal is written into a plurality of memory cells simultaneously. The data is written considering the polarity of each memory cell such that the same phase data are stored in the plurality of memory cells connected to the intersection of bit lines and selected word lines.

According to one feature of the invention, a semiconductor device comprises memory cell arrays in which memory cells disposed in intersection of bit lines and word lines are arranged in a matrix; an input terminal to which a pattern signal is input when a compression test is conducted; input buffer means connected to said input terminal for outputting said pattern signal supplied from said input terminal to one of plural write data buses; a write circuit for writing said pattern signal data into said memory cells through said write data buses; first switches that selectively connect said one of plural write data buses to others of the plural write data buses; and a control unit for controlling said first switches in response to a compression test entry signal which starts the compression test.

According to a second feature of the invention, a testing method of semiconductor device comprises the steps of: testing a semiconductor device including memory cell arrays in which memory cells disposed in intersection of bit lines and word lines are arranged in a matrix, selecting one line for inputting test pattern and plural lines for not inputting the test pattern from at least one of bit lines and word lines; activating the physical pattern generating means [means for selecting input terminal of test pattern which select if a test pattern predetermined for specific tests of the semiconductor is inputted or not in each terminal of plural lines selected from at least one of bit lines and word lines]; and means for generating physical pattern which is composed so that the predetermined data is outputted in each data buses connected to the other plural lines, when the certain data is inputted in the lines selected to input the test pattern and the certain data is outputted in the data buses connected to the lines.

The semiconductor device of the invention adopts the basic technology construction and so, the predetermined particular physical pattern can be written in certain cells, where the products, such as process products using CPF type cells, in which bit map is complicated are checked by wafer tests or other tests which need bit compression, and the address information is not necessary unlike conventional technology.

Accordingly, according to the invention, accurate testing can be done by simple change of circuit without affecting address signals.

BRIEF DESCRIPTION OF THE DRAWINGS

The invention will be explained in more detail in conjunction with appended drawings, wherein:

FIG. 11 is an explanatory diagram showing polarity arrangements of cells in memory cell array used in a semiconductor device according to the invention, FIG. 12 is a diagram showing an example in which physical pattern is written in memory cell array used in a semiconductor device recording to the invention, and FIG. 13 is a diagram showing another example in which physical pattern is written in memory cell array used in a semiconductor device according to the invention.

DESCRIPTION OF THE PREFERRED EMBODIMENTS

Next, a semiconductor device in a first preferred embodiment according to the invention will be explained below.

Figure 1A:
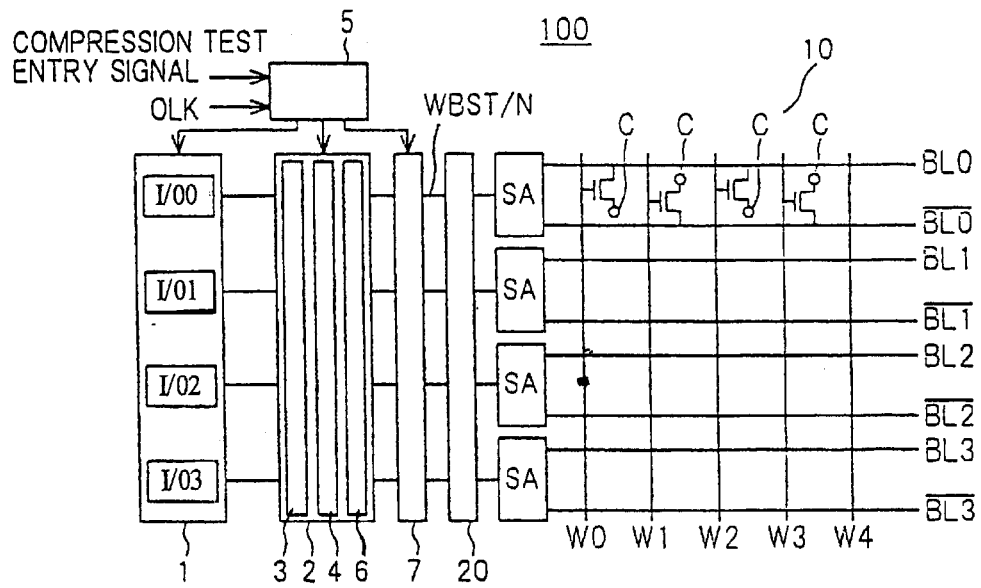
FIGS. 1A and 1B are block diagrams showing a semiconductor device in a first preferred embodiment according to the invention.
Figure 1B:
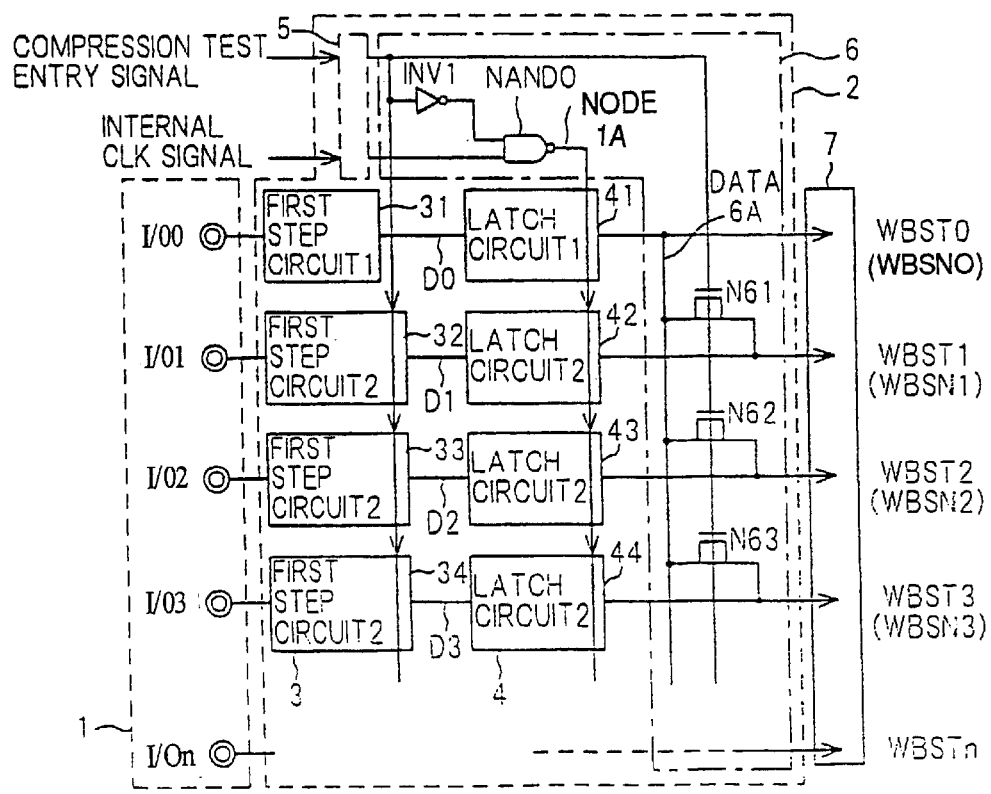

FIGS. 1A and 1B are circuitry diagrams showing the enlarged main point of a circuit of a semiconductor device in the first preferred embodiment according to the invention.

In FIG. 1A, semiconductor device 100 includes memory cell array 10 in which memory cells C are disposed in each intersection of plural bit lines BL and plural word lines W, which meet at right angles, and are arranged in a matrix. The semiconductor device 100 is provided with input terminals denoted herein as means 1 for selectively inputting a test pattern and means 2 for generating physical pattern. The means 1 for selectively inputting a test pattern can selectively input or not input the test pattern predetermined for specific test in each (e.g. each of bit lines BL 0 to BL 3 or each of BL 0 (bar) to BL 3 (bar)) of at least one of plural lines (e.g. input output terminal I/O 0 to I/O 3 of each of bit lines BL) which are chosen from the bit lines BL and the word lines W. The means 2 for generating physical pattern is composed so that the certain data is inputted in the line chosen for inputting the test pattern and is outputted in the write data buses (e.g. WBST 0) connected with the line, and simultaneously, the predetermined data is outputted in each of the data buses (e.g. WBST 1 to WBST 3) connected with plural lines other than the line.

In FIG. 1B, only WBST 0 to WBST 3 are shown as the write data buses connected with the bit lines of the memory arrays in the semiconductor device of the invention, but it is needless to say that write data buses WBSN 0 to WBSN 3 connected to the bit lines BL (BL bar) which have data polarity opposite to that of the bit lines BL can be also selected.

In the following explanation of the invention, polarity of write data buses connected with the bit lines BL and polarity of memory cells connected to the buses are shown by T (true) and polarity of write data buses connected with the bit lines/BL (BL bar) and polarity of memory cells connected with the buses are shown by N (bar).

The lines selected in the invention may be the bit lines or the word lines as described above, and it is more preferable to use the bit lines. As far as the bit lines are concerned, it is more preferable that each bit line is connected, through write data buses to one input/output means (I/O 0 to I/O 3), with two bit lines (BL and BL (bar)) which are composed for processing the data of opposite polarity.

It is required that the semiconductor device of the invention is constructed to write certain physical pattern in certain line and simultaneously to write the certain physical pattern in the lines corresponding to the other input/output terminals as many as possible. For this purpose, it is necessary that one selected input/output terminal and a plurality of the other input/output terminals are treated as a group. The number of the other input/output terminals is not specified and it is preferable that at least three terminals are treated as a group.

Actually, eight, sixteen and thirty-two of the terminals are used as a group for the compression test. As the case may be, it is possible that a group formed by four terminals (e.g. I/O 0 to I/O 3) is repeatedly arranged.

As basic pattern of the group construction, the number of the lines connected with the input/output terminal (I/O 0) which is selected by the means for selecting the test pattern input/output terminal is at least three (i.e. combination of WBST 1 to WBST 3 or of WBSN 1 to WBSN 3). The number of the lines means that of the terminals (I/O) which are combined with the write data buses WBST 0 or WBSN 0 and in which the test pattern is not inputted.

It is preferable that the means 2 for generating the physical pattern includes an input buffer means 3 and a latch means 4, which are connected to each of the write data buses WBST (N) that are a plurality of the selected lines. In the semiconductor device 100 of the invention, the input buffer means 3 and latch means 4 connected to the lines (e.g. write data buses WBST 0 or WBSN 0) which are selected by the means 1 must have construction different from the input buffer means 3 and latch means 4 connected with the lines (e.g. WBST 1 to WBST 3 or WBSN I to WBSN 3) which are not selected by the means 1.

It is preferable that the means 2 for generating the physical pattern in the semiconductor device 100 of the invention includes means 5 for inputting a controlled signal that controls, by a compression test entry signal and an internal clock signal, the input buffer means 3 and latch means 4 connected with the lines which are not selected by the means 1.

The selection of the input/output means (I/O) may be automatically set by a predetermined inspection mode and may be carried out by a predetermined pattern. It is preferable that the means 2 for generating the physical pattern in the invention further includes a switch unit 6 which supplies each of the lines (e.g. write data buses WBST 1 to WBST 3) connected with the terminals (I/O 0 to I/O 3) which are not selected by the means 1 with the output data provided from the lines (e.g. latch means 4 in the write data buses WBST 0 connected with the terminal (e.g. I/O 0)) which are selected by the means 1. The output data may be converted to different data.

The means 2 for generating physical pattern in the invention is used to write a physical pattern of predetermined certain data in the write data buses WBST 0 and the write data buses WBST 1 to WBST 3 connected with a group of other plural input/output means (I/O 0 to I/O 3) per the selected word line, and should not be limited to any specific one.

The physical pattern is different by a cell arrangement of semiconductor device to be tested, polarity of cells, testing purpose, etc. The simplest physical pattern is to write "H" or "L" level data in all of write data buses WBST 0 to WBST 3.

An example of writing operation by the means 2 for generating the physical pattern is to completely coincide the data in the certain lines which are selected by the means 1 with the data in the other plural lines which are not selected by the means 1.

The means 2 can be used to select only one of bit line which belongs to a pair of bit lines (BL, BL) or to select both of bit lines which have different polarity. The operation for selecting either or both of the bit lines (BL, /BL) is same as that for selecting either of the write data buses WBST 1 to WBST 3 or WBSN 1 to WBSN 3. Such the operation can be implemented by means 7 for selecting write data buses (WBST) disposed next to the means 2.

The means 7 for selecting write data buses (WBST) can control the information such as polarity arrangement map of cells shown in FIG. 11 by using a control signal. As shown in FIG. 1A, the means 7 in the invention is connected through a write amplifier (WAMP) 20 with respective sense amplifier SA connected with each of a pair of the bit line (BL, BL (bar)).

The line between the means 7 and the write amplifier (WAMP) 20 is called write data buses WBST/N. Arrangements of cells in the semiconductor device of the invention are not limited and therefore, the semiconductor device having any kinds of cell array types can be used in the invention.

Figure 9:
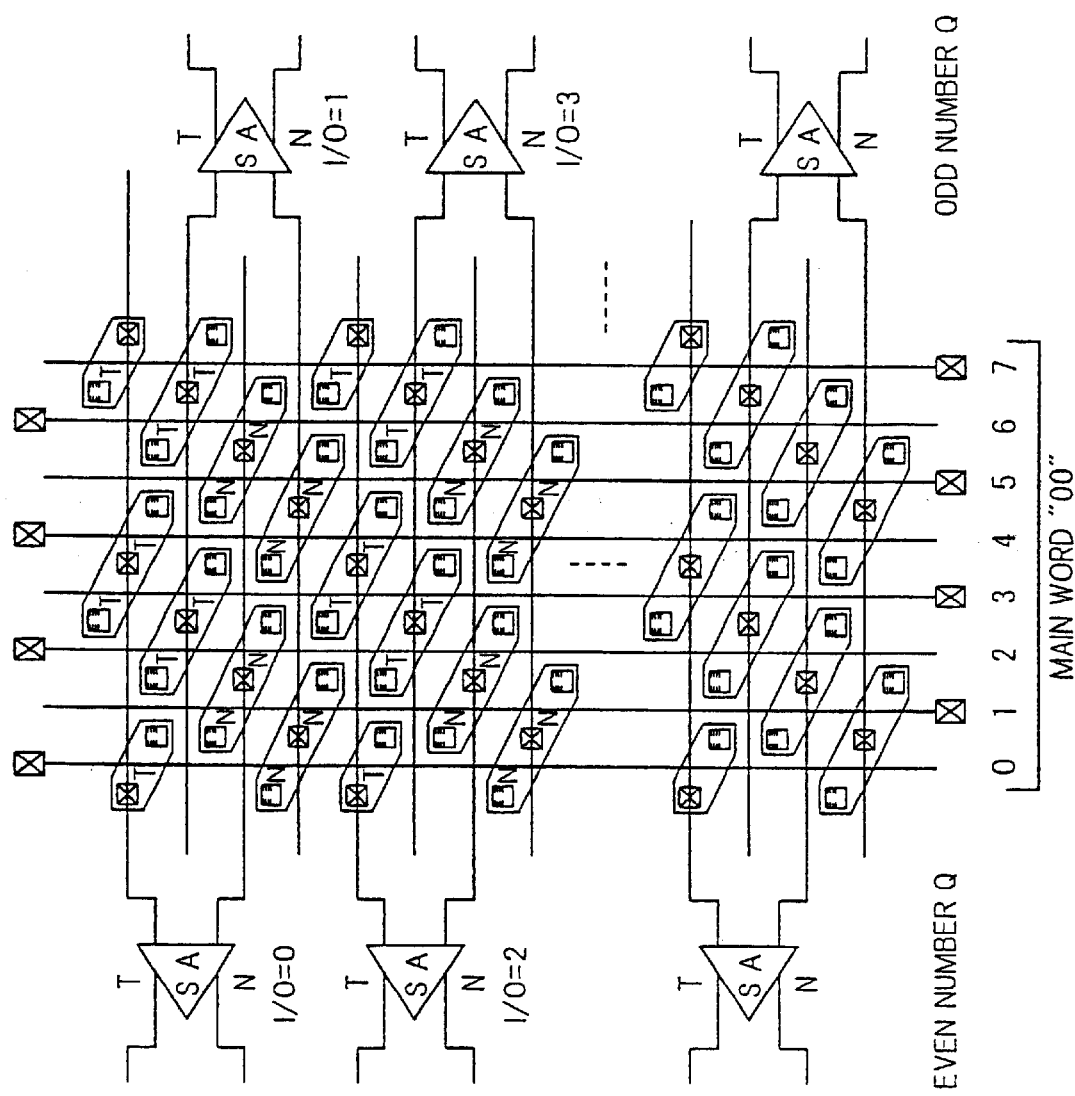
FIG. 9 is a block diagram showing cell arrangements in memory cell array shown in FIG. 8 according to the invention.

Accordingly, the semiconductor devices according to the invention may include the constructions shown in FIG. 1A, and the cell arrangement constructions shown in FIG. 9 and disclosed in the conventional arts. The means 2 used in the invention implements to select certain write data buses WBST 0 to WBST 3 and to write certain data by driving a predetermined specific circuit using a certain control signal, while required data is written by selecting certain write data buses using an address information in conventional and testing method of semiconductor device.

The means 2 can control, through the controlled signal input means 5 by the compression test entry signal, internal clock signal and physical pattern test entry signal, the input buffer means 3 and the latch means 4, both of which are in the lines which are not selected by the means 1, and the data conversion means 6.

FIG. 1B is an enlarged view showing the means 1 and the means 2 in the semiconductor device according to the invention shown in FIG. 1A. As shown in FIG. 1E, the example of semiconductor device of the invention comprises the four input/output means (I/O) which make a group by one input/output means (I/O 0) selected as the input/output means (I/O) to input certain physical pattern and three input/output means (I/O 1 to I/O 3) selected as the input/output means (I/O) not to input certain physical pattern as a group.

Figure 8:
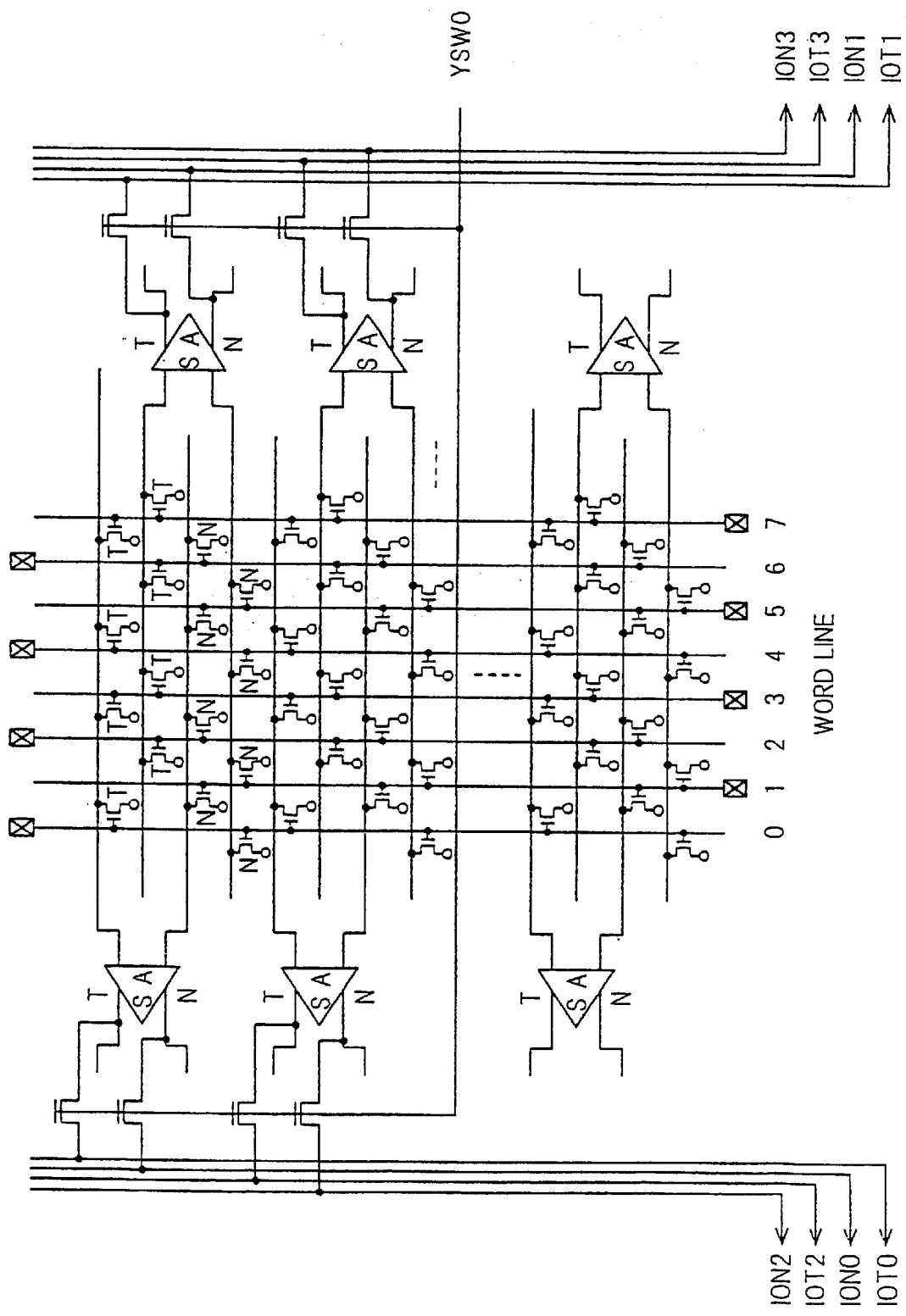
FIG. 8 is a block diagram showing an example of memory cell array used in a semiconductor device according to the invention.

In this embodiment, the means 1 comprises four input/output means (I/O 0 to I/O 3) and the means 2 for generating physical pattern is composed of four input buffer means 3 (numeral 31 to 34 in FIG. lB), four latch means 4 (numeral 41 to 44 in FIG. 1B) and switch unit 6. The switch unit 6 has such circuit construction that inverter INV 1, NAND gate circuit 0 and transistors N 61 to N 63 are connected as shown in FIG. (B), and each of the circuit is controlled by compression test entry signals and internal clock signals which are inputted in control signal input unit as a control signal to output one of physical pattern data which is disposed in each of the write data buses WBST 0 to WBST 3, in advance. FIGS. 8 and 9 show the construction of the memory cells of semiconductor device 100 according to the invention. The cell arrangement style of the memory cells 10 shown in FIGS. 8 and 9 is a CPF type cell construction which makes bit map to become complicated. In FIGS. 8 and 9, "N" and "T" each represent polarity of the data, and cells connected with the "N" side of a paired digit lines are "N" and cells connected with the "T" side of a paired digit lines are "T".

FIG. 11 shows polarity arrangements of cells in the CPF type cell construction. If "1" data is written in the input/output means the I/O 0 according to FIG. 11, the IOT 0 signal is "H" level and I/ON 0 signal is "L" level. If the word line W 1 is selected at the time, "H" level is written in the cell N 1.

Further, if the word line W 1 is selected, "L" level is written in the cell N 2. In case where the cells are selected which are connected with the "T" side of a paired digit lines (bit lines BL, BL (bar)), "H" level data is written, and in case where the cells are selected which are connected to the "N" side of a paired digit lines (bit lines BL, BL (bar)), "L" level data is written although "1" data is written from outside.

Accordingly, in the testing of semiconductor device 100 having cell arrays which have arrangements of cell polarity "T" or "N" as shown in FIG. 11, the means 1, the means 2 and the means 7 for selecting the bit lines are used. Thus, in case where the word lines 0 are selected, "H" level data is written in the input/output means connected with the write data buses WBST 0 and WBST 2 which are connected to I/O 0 and I/O 2 and "L" level data is written in the input/output means connected to the write data buses WBSN 1 and WBSN 3 which are connected to I/O 1 and I/O 3, as shown in FIG. 12.

In case where word lines 2 or more is selected, the data shown in FIG. 12 is also written in write data buses, respectively. Namely, the data shown in FIG. 12 is the physical pattern that is defined in the invention, and in other words, the means 2 are designed.

As described above, it is preferable that unit 6 are disposed in each of the lines which are not selected by the means 1, and that the switch unit 6 are composed of, for example, transistors N61 to N63. In the invention, the first terminal of the transistors is connected with the write data buses WBST 0 or WBSN 0 which is connected with output of the latch means connected with the input/output means (I/O) selected by the means 1, and the other terminal of the transistors is connected with the output of the latch means (i.e. the write data buses WBST 1 to WBST 3 or WBSN 1 to WBSN 3) connected with the lines which are not selected by the means 1.

The means 2 for generating physical pattern of the invention controls the input buffer means 3, the latch means 4 and the switch unit 6 in the input/output means (I/O), which are not selected by the means 1, by the compression test entry signal and the internal clock signal which are inputted in the control signal input means 5.

The construction of the input buffer means 3 latch means 4 used in the invention is not limited to any specific one, and maybe conventional one. An example thereof is shown in FIGS. 5 and 6.

Figure 5A:
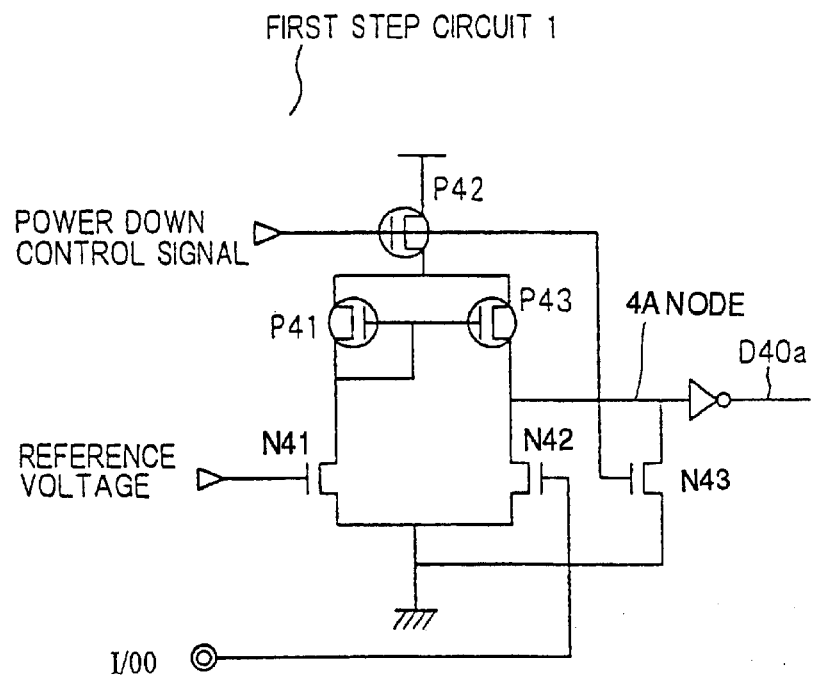
FIGS. 5A and 5B are block diagrams showing an example of input buffer means used in a semiconductor device according to the invention.

FIG. 5A is a block diagram showing the construction of input buffer means 31 connected with the first input/output means (I/O 0) among input buffer means 3 in FIG. 1B.

That is, the input buffer means 31 is composed of transistors P41, N41, P43, N42 making up a current mirror amplifier, and transistors P42, N43 controlling the movement and non-movement of the circuit. The input buffer means 31 in the invention is made so that POWER-DOWN control signal is inputted in the transistor P42, N43 and so that the means 31 works in any time other than POWER-DOWN mode.

Figure 5B:
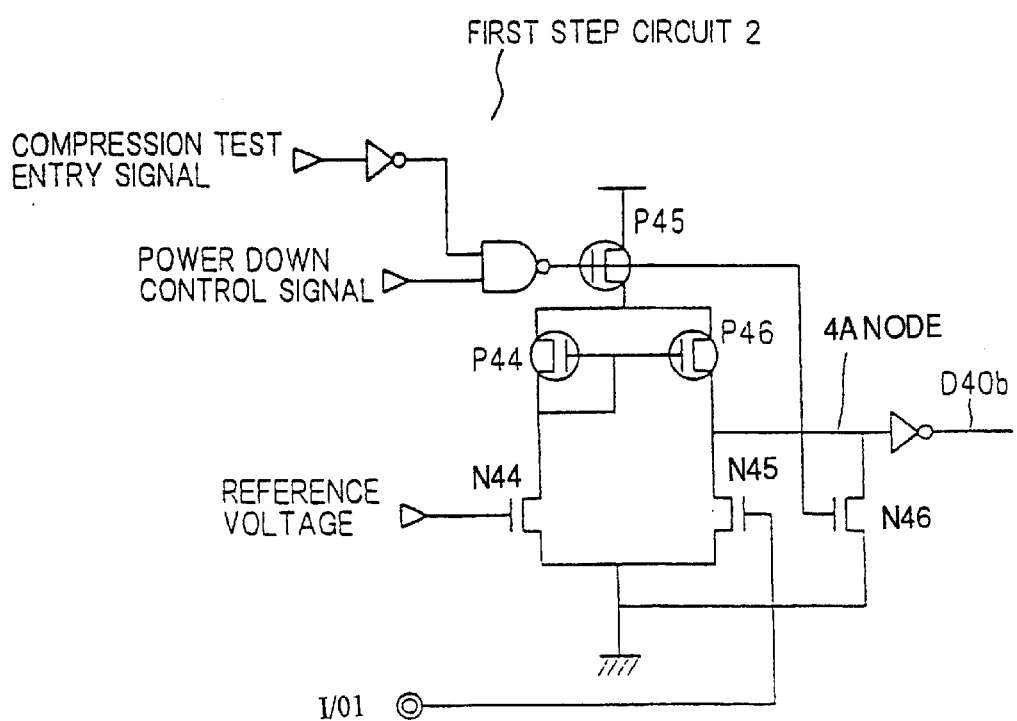

FIG. 5B is a block diagram showing the construction of input buffer means 32 to 34 connected with the second to fourth input/output means (I/O 1 to I/O 3) among input buffer means 3 in FIG. 1B. That is, the input buffer means 32 to 34 are composed of transistors P44, N44, P46, N45 making up a current mirror amplifier, and transistors P45, N46 controlling the movement and non-movement of the circuit.

The input buffer means 32 to 34 in the invention are made so that POWER-DOWN control signal and compression test entry signal are inputted in the transistors P45, N46 and so that the means 32 to 34 stop to work and leakage current is prevented in compression test mode.

Figure 6A:
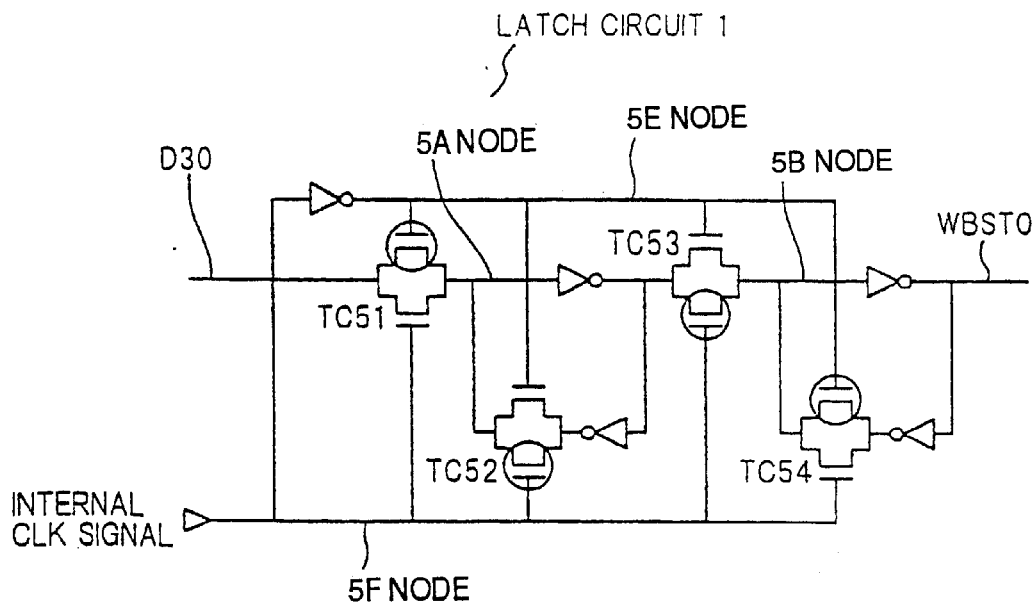
FIGS. 6A and 6B are block diagrams showing an example of latch means used in a semiconductor device according to the invention.

FIG. 6A is a block diagram showing the construction of latch means 41 connected with the first input/output means (I/O 0) among latch means 4 in FIG. 1B. That is, the latch means 41 is composed of transfer gate transistor TG 51, TG 52, TG 53, TG 54 and inverter which are connected with each other shown in FIG. 6A, and is controlled by the internal clock signal.

Figure 6B:
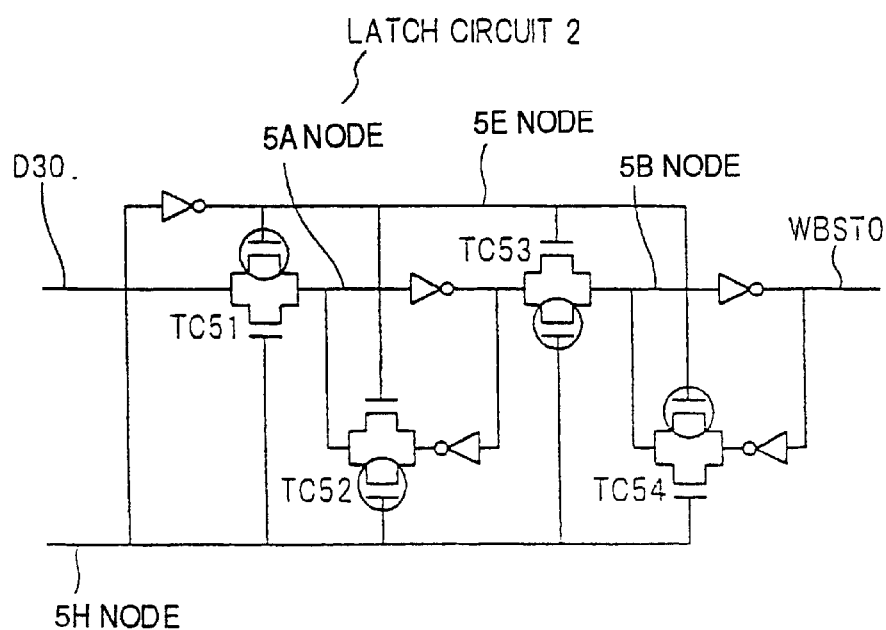

As shown in FIG. 6B, the latch means 42 to 44 have same construction as the circuit in FIG. 6A, but its control signal is the output of NAND gate circuit 0 in which the internal clock signal CLK and the compression test entry signal are inputted. Accordingly, the latch means 42 to 44 do not work in the compression test mode in which the compression test entry signal is outputted.

However, the number of the physical pattern to be applied is limited in the above examples depending on the construction of the means 2 for generating physical pattern, and therefore, it is difficult to adopt wide variety of physical pattern.

For example, in case where it is required that "H" level data are written in all of write data buses WBST 0 to WBST 3 or WBSN 0 to WBSN 3 which are connected with the selected input/output means (I/O) even if any word lines are selected regardless of polarity arrangement of memory cells as shown in FIG. 13, such the requirement can not be achieved by the means 2 for generating physical pattern shown in FIG. 1B.

In a second preferred embodiment according to the invention, there is used the means 2 for generating physical pattern by which wide variety of physical pattern can be adopted.

Figure 2:
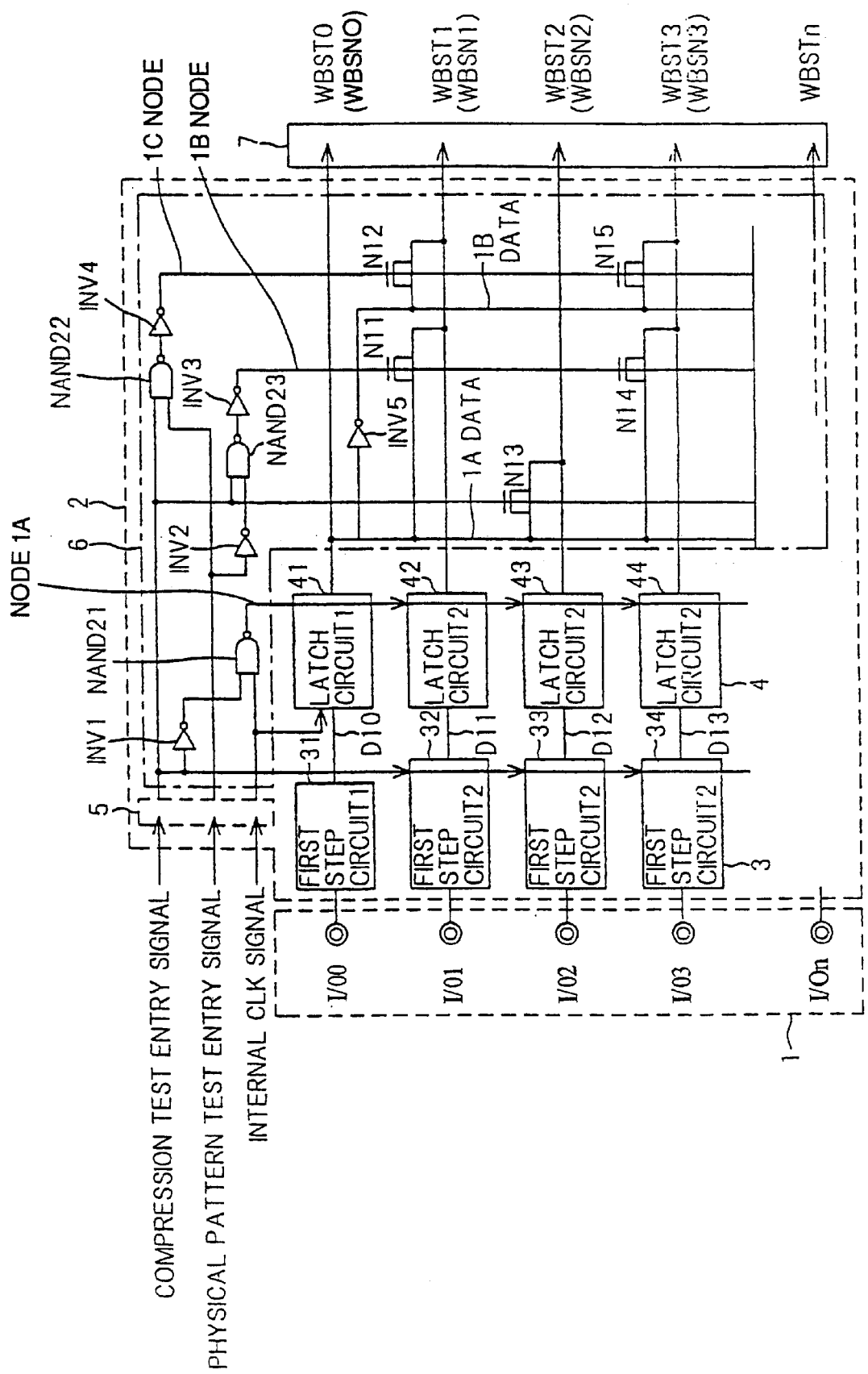
FIG. 2 is a block diagram showing a semiconductor device in a second preferred embodiment according to the invention.

FIG. 2 is a block diagram showing the second preferred embodiment according to the invention, which is the construction of semiconductor device composed of the means 1 for selecting test pattern input terminal, the means 2 for generating physical pattern and the means 7 for selecting bit lines.

The control circuit shown by the block diagram in FIG. 2 uses the semiconductor device 100 having the cell array disposition and the cell polarity arrangement shown in FIG. 8 or FIG. 9. That is,. where compression test mode is used similar to the first embodiment in the wafer test or the test requiring bit compression of semiconductor device products such as products using CPF type cells in which bit map is complicated, rear-out and write-in are carried out only in I/O 0 terminal.

Accordingly, in case where certain physical pattern is written, the physical pattern written in I/O 0 is also fed to the write data buses WBST 1 to WBST 3 or WTSN 1 to WTSN 3, each of which is connected with each of the other input/output means I/O 1 to I/O 3. That is, the construction of input buffer means 31 to 34 and latch means 41 to 42 for the means 1 for selecting the input terminal and the means 2 for generating physical pattern in the embodiment is substantially same as that of the first embodiment.

However, the construction of the switch unit 6 and control signal input means 5 in the embodiment is different from that of the first embodiment. That is, three signals of the compression test entry signal, the physical pattern entry signal and the internal clock signal are used in the control signal input means 5 of the embodiment, and inverters INV 1 to 5, NAND gate circuits 21 to 23 and transistors N11 to N15 in the circuit construction of the switch unit 6 are arranged and connected with each other as shown in FIG. 2.

The write data buses WBSN 0 to WBSN 3 processing the different polarity data are disposed as well as the write data buses WBST 0 to WBST 3 (not shown but similar to in FIG. 1) and the means 7 for selecting either of write data buses composing of the bit lines (BL, BL) is disposed in the embodiment of the invention as well as in the first embodiment described above.

In case where the physical test mode is used and the same data buses WBST 0 to WBST 3 are selected in the example, the same data are written in I/O 0 and I/O 2 and the inverted data are written in I/O 1 and I/O 3. In case where the physical test mode is not used, the same data are written in I/O 0 to I/O 3.

Same data can be written in all write data buses in the word lines as shown in FIG. 13 by selecting polarity of the write data buses in consideration of the polarity of cells. The proper use of these can be done by selecting if the entry to the test mode is made or not by physical pattern to be written.

The semiconductor device in the second preferred embodiment according to the invention comprises input terminals of input/output means I/O 0, I/O 1, - - -, I/O n, and a first step circuit for amplifying the data inputted from the input terminal, i.e. the input buffer 3 and the latch circuit 4 latching the output data D 10, 11, - - - of the input buffer means 3 as shown in FIG. 2.

Two kinds of the input buffer means 3 exist, and the data inputted in I/O 0 is inputted in the input buffer means 31 and the data inputted in I/O 1 to 3 are inputted in the buffer input means 32 to 34. The output of the latch means 4 is outputted in the write data buses WBST 1 to WBST 3, and the data 1A is connected with WBST 1 through transistor N11, WBST 2 through transistor N13 and WBST 3 through N14. It is controlled by the compression test mode signal and physical test entry signal.

The inverted data 1B of WBST 0 is connected with WBST 1 through transistor N12 and WBST 3 through transistor N15. It is controlled by the contact point 1C.

Then, the operation or function in this embodiment according to the invention will be explained below.

In FIG. 2, compression test mode entry signal is "H" level where entry to the compression test mode is made. In the case, the input buffer means 31 is controlled in different manner from the input buffer means 32 to 34 in the input buffer means 3.

The input buffer means 31 shown in FIG. 5A fetches the level of input terminal without depending on the level of compression test mode entry signal, and where the compression test mode entry signal is "H" level, the input buffer means 32 to 34 shown in FIG. 5B do not fetch the level of input terminal I/O 0 and the node 4B is fixed to GND level by N46.

In other words, in the above mode, the level of D10 shown in FIG. 2 is changed by the input/output terminal I/O 0 and D11, D12, D13 - - - are fixed to "H" level.

The data of the node 1A inputted to the latch circuit 4 is made by the internal CLK signal and compression test entry signal, and where the compression test entry signal is "H" level, the node 1A is fixed to "H" level.

Accordingly, the latch circuit 41 shown in FIG. 6A usually operates by the internal CLK signal without depending on the node 1A, and TG 57 is in the non-conductive condition and TG 58 is fixed in the conductive condition, because the data in the node 5H is fixed to "H" level in the latch circuits 42 to 44 shown in FIG. 6B. That is, the level of the node 5D is in the latched condition.

That is, the levels of D11, D12, D13 - - - are not transmitted to WBST 1, 2 and 3.

In the above state, where the physical pattern test entry signal is "H" level, the node 1C is "H" level and the node 1B is "L" level. The compression test entry signal is "H" level and so, Nch transistors N13, N12 and N15 are in the conductive condition and Nch transistors N11 and N14 are in the non-conductive condition.

The data inputted in the input terminal I/O 0 is transmitted to WBST 0, and the data 1A is the same data as the inputted data and the data 1B is the inverted data. Since N12 and N15 through which the data 1B is transmitted are in the conductive condition, the inverted data of WBST 0 is transmitted to WBST 1 and 3, and the same data as WBST 0 is transmitted to WBST 2.

In case where the physical pattern test entry signal is "L" level, the node 1C is "L" level and the node 1B is "H" level. Accordingly, the data 1A is transmitted to WBST 1, 2 and 3 because conductive transistors are N11, N14 and N13, and therefore the same data as WBST 0 is transmitted.

Whether the same data as WBST 0 is transmitted to the write data buses WBST 1 to WBST 3 or the inverted data is transmitted can be decided by selecting "H" level or "L" level as the physical pattern test entry signal.

As described above, it is preferable in the invention that the means for generating physical pattern controls the input buffer means and the latch means in the lines that are not selected by the means for selecting the test pattern input terminal, and the data conversion means by the compression test entry signal and the internal clock signal, and that the means for generating physical pattern controls the data conversion means by the output signal of the input buffer means, which is connected with one of the lines that are not selected by the means for selecting the test pattern input terminal, the compression test entry signal and the internal clock signal.

Further, it is preferable in the invention that the means 2 for generating physical pattern has such circuit construction that the physical pattern predetermined by the polarity arrangement of cells connected with each bit line and by the inputted pattern data is outputted in the write buses corresponding to certain bit lines, that is the bit line selecting means 7.

Figure 4:
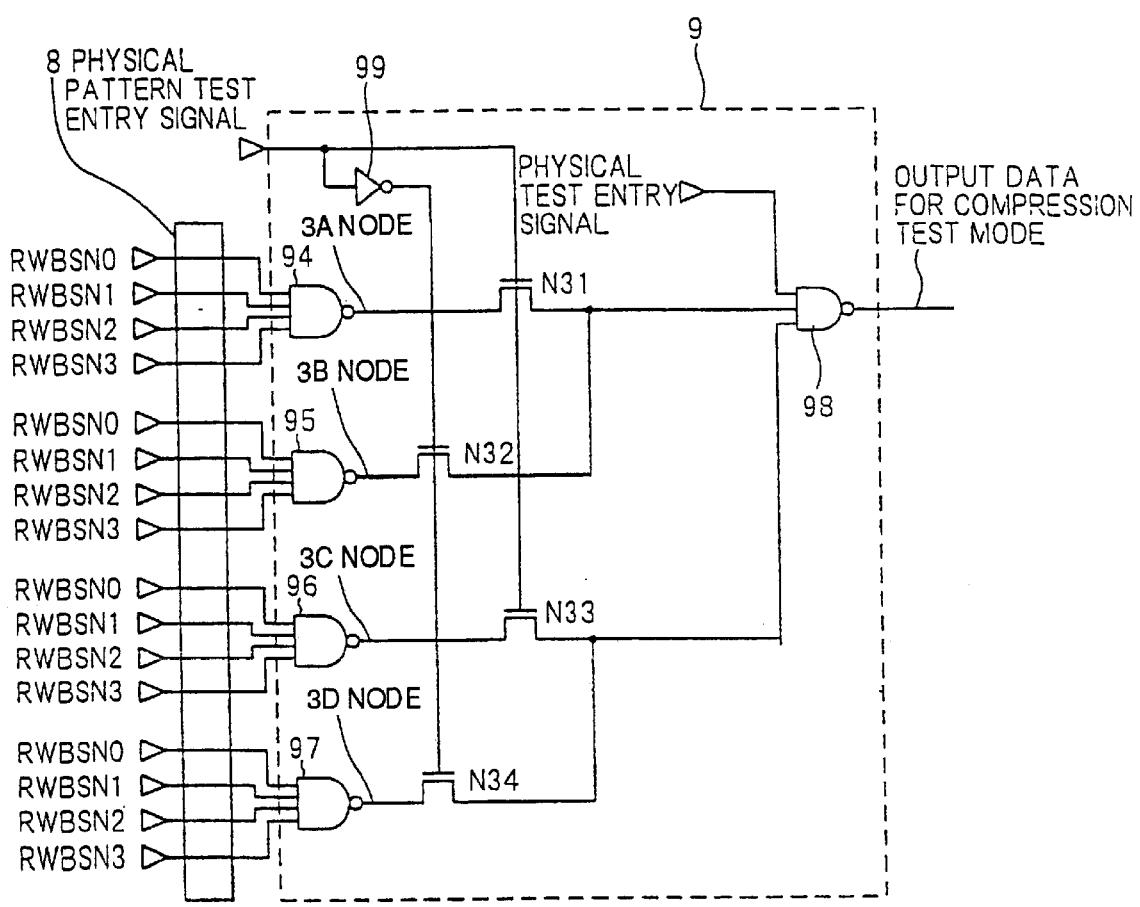
FIG. 4 is a block diagram showing an example of read-out circuit of, physical pattern used in a testing method of semiconductor device according to the invention.
Figure 7:
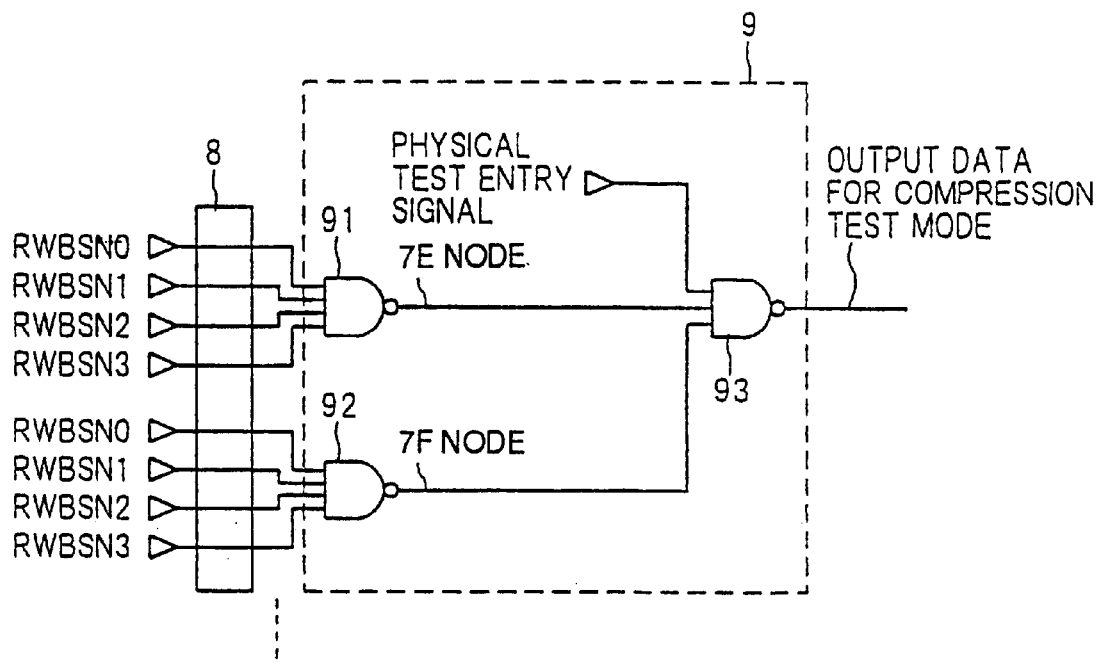
FIG. 7 is a block diagram showing another example of read-out circuit of physical pattern used in a testing method of semiconductor device according to the invention.

The operation to read-out the physical pattern will be explained below. FIG. 7 is an explanatory view showing read-out function of the physical pattern data in case where the example 1 of the invention is used, and FIG. 4 is an explanatory view showing read-out function of the physical pattern data in case where the example 2 of the invention is used.

FIG. 7 shows the case that all of the read write data buses RWBST 0 to RWBST 3 or RWBSN 0 to RWBSN 3 corresponding to the read write data buses WBST 0 to WBST 3 or WBSN 0 to WBSN 3 to be used for test are fixed to either polarity in the example 1, and that same data is written in all of WBST 0 to WBST 3, i.e. either of "H" level or "L" level, as the physical pattern.

Concretely, the read-out circuit of physical pattern is composed of the means 8 for selecting the read-out write data buses connected with the read write data buses RWBST 0 to RWBST 3 or RWBSN 0 to RWBSN 3, and the decision means 9. The means 8 is constructed so that suitable read write data buses can be selected from the read write data buses RWBST 0 to RWBST 3 or RWBSN 0 to RWBSN 3 of different polarity by considering the polarity of the physical pattern and cell array to be used.

The decision means 9 is used to decide if data of each read/write data buses which is inputted in the certain read/write data buses selected in accordance with either of physical pattern is coincidence with the physical pattern.

In this embodiment, in which "H" level data is written as physical pattern in all of the write data buses WBST 0 to WBST 3, the read/write data buses RWBST 0 to RWBST 3 corresponding to the write data buses WBST 0 to WBST 3 by the means 8 for selecting the read/write data buses shown in FIG. 7, and the data is inputted in first decision means 91 of the decision means 9.

The first decision means 91 comprises four input terminal type NAND gate circuit to decide if all data of read/write data buses are "H" level. In the testing of the invention, error may exist where data is tested only in true (T) side and so, the test results are decided by the data tested in bar (N) side and the compression test entry signal.

The second decision means 92 is used to decide if all of the read/write data buses RWBSN 0 to RWBSN 3 of different polarity from WBST 0 to WBST 3 are "L" level. The output of first decision means 91 and the second decision means 92 is inputted in the three terminal type NAND gate 93 and is tested together with the compression test entry signal.

Accordingly, according to the decision circuit shown in FIG. 7, the "H" level signal is outputted from the decision means 9 and the test results can be confirmed.

FIG. 4 is a block diagram showing an example of the construction of read-out decision circuit used in the example 2, which is basically composed of the means 8 for selecting read/write data buses and the decision means 9.

The decision means 9 in this example has a plurality of decision circuits, because a wide variety of physical pattern is used. For example, four NAND gate circuits 94 to 97 which are fourth to seventh input terminals are disposed in the decision circuit 9 in FIG. 4.

The cell array shown in FIG. 8 or 9 is used in the fourth decision means 94. If the physical pattern of 0, 1, 0, 1 is written in the write data buses connected with the input/output means I/O 0 to I/O 3 in case where the polarity of each cell in the cell array is disposed as shown in FIG. 11, the polarity of the write data buses has to be considered so that all data are "H" level when the fourth decision means 94 is input. An example of this case is a combination of the write data buses connected with the decision means 94.

The combination is selected by the means 8 for selecting read/write data buses. The data of the physical pattern in write data buses of the polarity different from the above one is tested in the decision means 96, and both of the test results are inputted in the decision means 99 composed of three terminal NAND entry signal and are tested together with the compression test entry signal.

In this case, the physical pattern entry signal is in "H" level and the above decision is carried out by the transistors N32 and N34 driven by the signal. In case where the physical pattern entry signal is in "L" level, the decision means 95 and 97 are selected by the transistors N32 and N34 driven by the signal.

The decision operation in the decision means 95 and 97 is omitted because it is same as the one explained in FIG. 7. In case where the physical pattern test entry signal is in "H" level, the nodes 3A and 3C are effective because the Nch transistors N31 and N33 are conductive. The read-out from the cells in which the data WBST 0, 1, 2, - - - are written is carried out through RWBSTN 0, 1, 2, - - - .

For example, in case where "H" data is written in WBST 0 and 2 and "L" data is written in WBST 1 and 3 in FIG. 2, RWBST/N 0 and 2 should be "H" data, RWBST/N 1 and 3 should be "L" data, RWBS/N 0 and 2 should be "L" data, and RWBS/N 1 and 3 should be "H" data. If the data which is read-out from the cells is in the above state, the nodes 3A and 3C are "H" level and "L" level, respectively. As the result, output data for the compression test mode is in "H" level.

If the read-out is carried out erroneously, the nodes 3A and 3C both are "H" level, the output data for the compression test mode is in "L" level, the output data for the compression test mode is in "L" level. In the case, the tip will be decided as FAIL. On the other hand, in the case where the physical pattern test entry signal is in "L" level, the nodes 3B and 3D are effective and correctness or error of the read-out of the data is decided as correctness or error.

With respect to read-out function of the semiconductor device according to the invention, in case of testing the device comprising memory cell arrays in which memory cells disposed in intersection of bit lines and word lines are arranged in a matrix; means for selecting input terminal of test pattern which select if the test pattern predetermined for specific tests of the semiconductor is inputted or not in each terminal of plural lines selected from at least one bit lines and word lines; and means for generating physical pattern which is composed so that the predetermined data is outputted in each data buses connected to the other plural lines, when the certain data is inputted in the lines selected to input the test pattern and the certain data is outputted in the data buses connected with the lines, the device contains means 8 for selecting the read-out buses which corresponds each of plural lines selected from at least one of bit lines and word lines, and the decision means 9 for deciding if the predetermined specific physical pattern is outputted from the read-out buses in comparison with the output data of the selected plural buses.

The means 8 for selecting the read-out buses in the invention is disposed so that one bit line (BL and /BL (bar)) can be selected from a pair of bit lines connected with each of input/output means. Further, it is preferable that the means 8 for selecting the read-out buses in the invention includes the means 81 for selecting the first read-out buses which are arranged so that the bit lines which provide the specific physical pattern data and the first output data having same output as each other are selected are selected from a pair of bit lines (BL and /BL (bar)) connected with each of input/output means.

It is also preferable that the second means 8 for selecting the read-out buses in the invention includes the means 82 for selecting the second read-out buses which are arranged so that the bit lines which provide the specific physical pattern data and the second output data having the same output as but different polarity from the first read-out data.

It is further preferable that the decision means 9 connected with the means 8 in the invention is composed of the first NAND gate circuit 94 and the second NAND gate circuit 96. In the invention, the decision means 9 that is the confirmation means is composed of three terminal type NAND gate circuit 98, in which the compression test entry signal is inputted with the output of the first NAND gate circuit 94 and the second NAND gate circuit 96.

The means 8 for selecting the read-out buses in the invention further includes such function that only bit lines having same polarity each other can be selected from a pair of bit lines (BL and /BL (bar)) connected with each of input/output means. In this case, the third NAND gate circuit 95 and the fourth NAND gate circuit 95 as the decision means are connected with the means 8.

According to the invention, the physical pattern can be written without using control of address information in wafer tests or other tests, which need bit compression, of products such as process products using CPF type cells, in which bit map is complicated. The reason is that the data is reverted in the semiconductor device of the invention in case that the data in the input terminal is transmitted as the other compression written data in input/output terminal.

The cell data in FIG. 13 is obtained by writing in the cells of the polarity shown in FIG. 11 with the cell polarity T/N shown in FIG. 8. The operation is carried out by writing "1" data at WORD of 0 or 4 and "0" data at WORD of 2 or 6 in the input terminal I/O 0 in the physical pattern test entry signal is "H" level, and "1" data at WORD of 3 or 7 and "0" data at WORD of 1 or 5 in the input terminal I/O 0 in the physical pattern test entry signal is "L" level.

A semiconductor device in a third preferred embodiment according to the invention will be explained by referring to FIG. 3.

Figure 3:
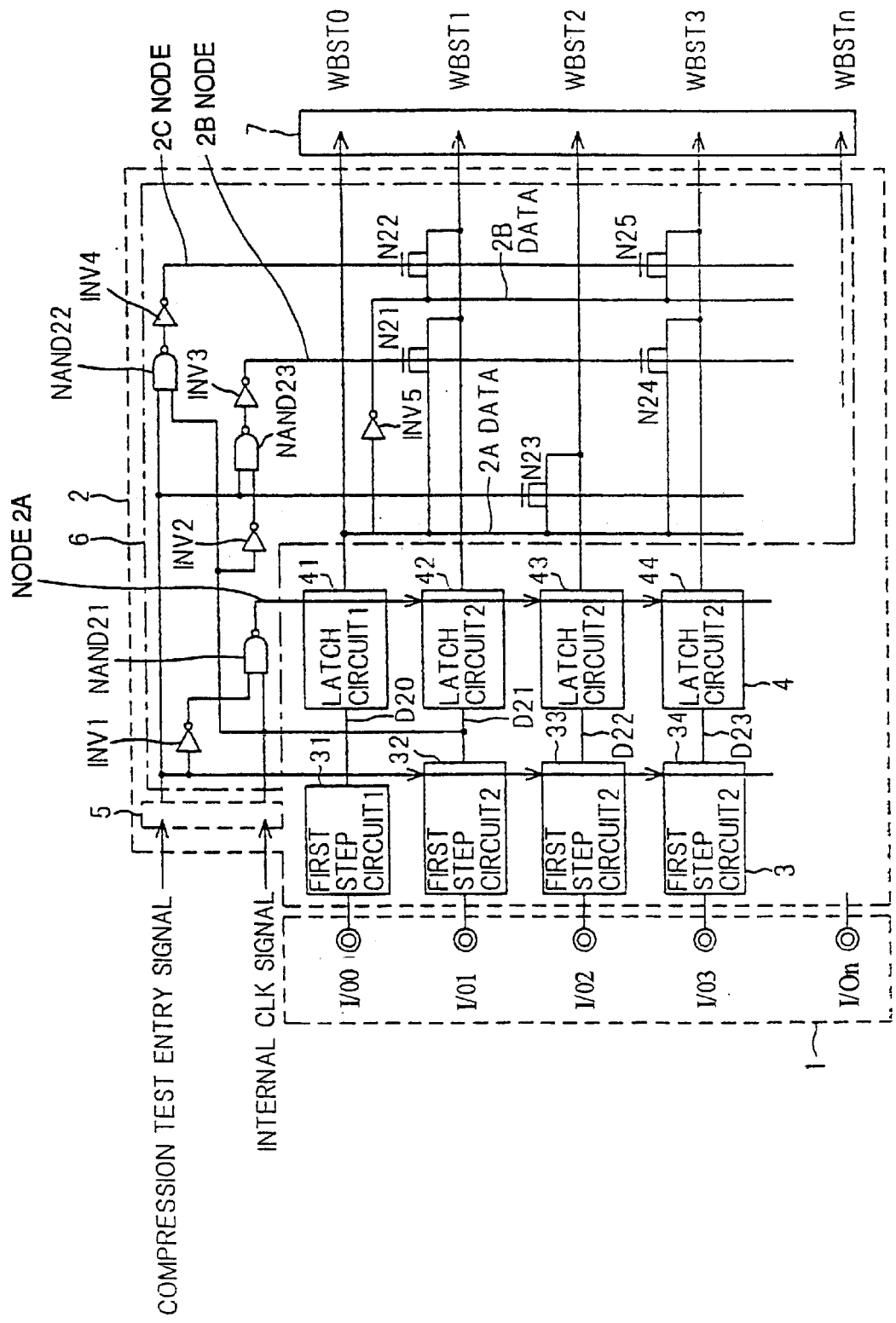
FIG. 3 is a block diagram showing a semiconductor device in a third preferred embodiment according to the invention.

FIG. 3 is a block diagram showing the construction of semiconductor device in the third preferred embodiment according to the invention. The construction is basically same as in the second preferred embodiment, wherein the physical pattern test entry signal is omitted and the control signal same as the signal is inputted from outside.

That is, it is possible that if even input/output means (I/O) in which the physical pattern can not be written is selected, the same operation as in inputting of the physical pattern test entry signal by inputting "H" level signal in any one of the input/output means (I/O).

It is preferable that the input buffer means for outputting a signal used to control the data conversion means in the input/output means which are not selected by the means 1 for selecting the test pattern input terminal has the same construction as that of the input buffer means connected with the lines selected by the means for selecting the test pattern input terminal.

In the third preferred embodiment, a testing time is shortened because it is not necessary that level of the physical pattern test entry signal is controlled by internal circuit. The testing method of invention is explained with regard to a synchronous DRAM controlling function and operation by CLK signal, and can be applied to any kinds of semiconductor device requiring an input of physical pattern.

The basic technical idea of the testing method in the invention is as follows. That is, a testing method of semiconductor device which comprises, in testing a semiconductor device including memory cell arrays in which memory cells disposed in intersection of bit lines and word lines are arranged in a matrix, selecting one line for inputting test pattern and plural lines for not inputting the test pattern from at least one of bit lines and word lines; activating the physical pattern generating means [means for selecting input terminal of test pattern which select if a test pattern predetermined for specific tests of the semiconductor is inputted or not in each terminal of plural lines selected from at least one of bit lines and word lines] ; and means for generating physical pattern which is composed so that the predetermined data is outputted in each data buses connected to the other plural lines, when the certain data is inputted in the lines selected to input the test pattern and the certain data is outputted in the data buses connected to the lines.

It is preferable that the means for generating the physical pattern in the invention are composed so that the input buffer means and latch means connected with the lines which are not selected by the means for selecting test pattern input terminal are controlled by at least compression test entry signal and an internal clock signal. And, it is preferable in the testing method of the invention that the means 2 further includes switch unit 6 which supplies the other plural lines which are not selected by the means 1 with the output data provided from the latch means 4 in the specific lines which are selected by the means 1.

The means 2 for generating the physical pattern should have functions to completely coincide the data in the certain lines which are selected by the means 1 with the data in the other plural lines which are not selected by the means 1.

As a read-out method of the written physical pattern in the testing method of the invention, there is a method which comprises, in testing a semiconductor device including memory cell arrays in which memory cells disposed in intersection of bit lines and word lines are arranged in a matrix, means for selecting input terminal of test pattern which selects if a test pattern predetermined for specific tests of the semiconductor is inputted or not in each terminal of plural lines selected from at least one of bit lines and word lines, and means for generating physical pattern which is disposed so that the predetermined data is outputted in each data buses connected with the other plural lines, when the certain data is inputted in the lines selected to input the test pattern and the certain data is outputted in the data buses connected to the lines, selecting read-out buses corresponding to the line connected with the input/output means which is disposed in at least one of bit lines and word lines and deciding if output data of the read-out buses shows the predetermined data pattern from the output data in each of the selected read-out buses.

In the method according to the invention, bit lines showing first output data which is same and specific physical pattern provided in the read-out buses may be selected from a pair of bit lines (BL, /BL (bar)) connected with each of input/output means and the outputted data may be compared with each other, or bit lines showing second output data which have same output as but different polarity from the first read-out data and specific physical pattern provided in the read-out buses may be selected from a pair of bit lines (BL, /BL (bar)) connected with each of input/output means and the outputted data may be compared with each other.

It is preferable in the testing method of the invention that comparative results of the first output data and comparative results of the second output data are inspected by using the compression test entry signal. This testing method should be made only in the case that the physical pattern test entry signal is effective.

In the method according to the invention, only bit lines which are same polarity may be selected from a pair of bit lines (BL, /BL (bar)) connected with each of input/output means by the means 8 for selecting read/write data buses and the outputted data may be compared with each other. Comparative results of the data of plural bit lines having first polarity and comparative results of the data of plural bit lines having second polarity may be inspected by using the compression test entry signal.

This testing method should be made only in the case that the physical pattern test entry signal is not effective.

Figure 10:
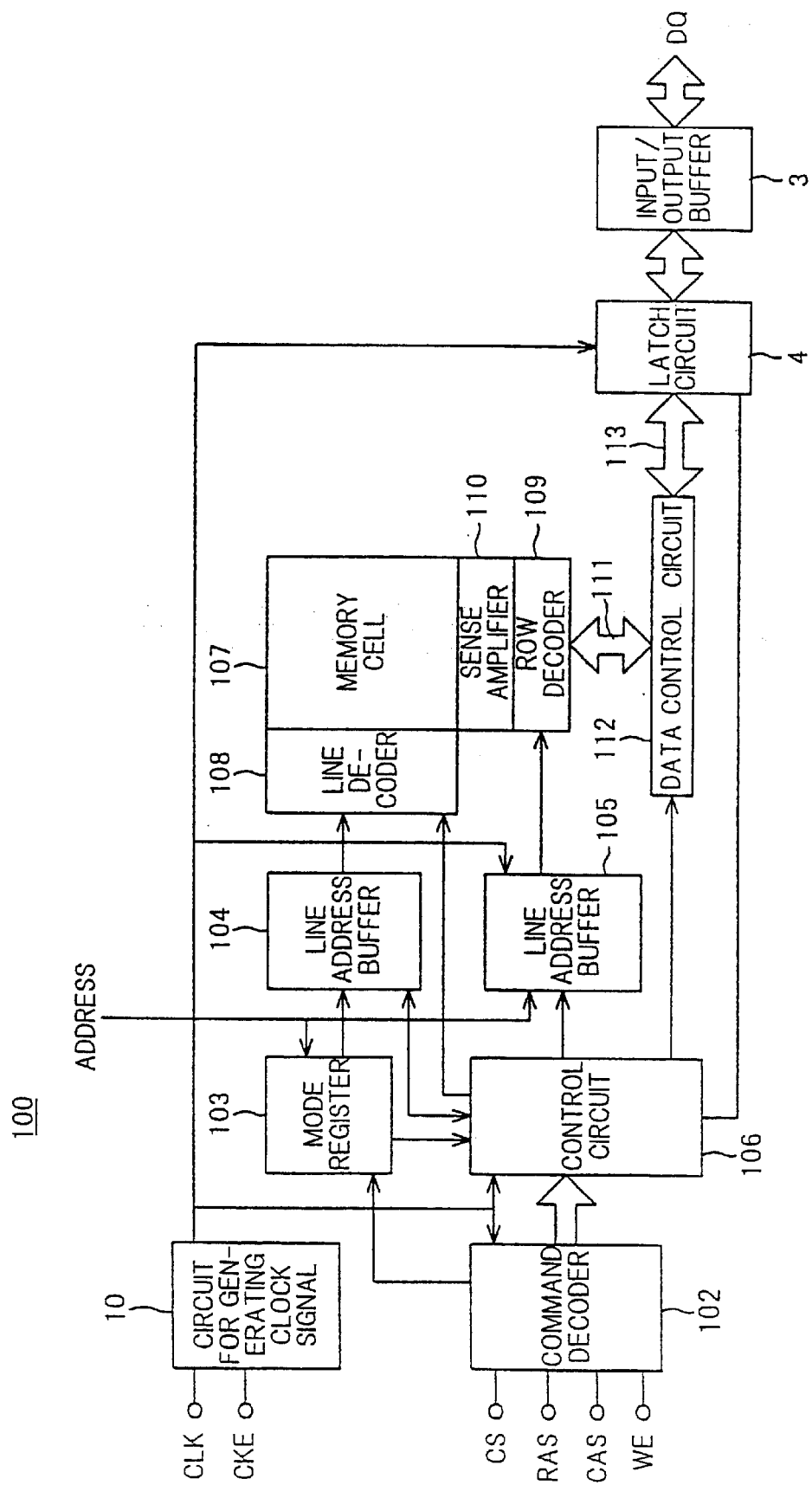
FIG. 10 is a block diagram showing an example of whole construction of a semiconductor device according to the invention.

FIG. 10 shows an example of circuit construction of a semiconductor device. 100 practically used. The semiconductor device 100 having the memory cell array 107 of the invention is driven by a line decoder 108 and a row decoder 109 through a sense amplifier 110 to select a specific cell of the memory cell array 107. The line decoder 108 and row decoder 109 are well known.

That is, a control signal from outside is inputted by a circuit 101 for generating a clock signal and a command decoder 102 and simultaneously, an address signal is inputted in a line address buffer 104 and a row address buffer 105, and the line address buffer 104 and row address buffer 105 are controlled by output order from the circuit 101 for generating clock signal and the command decoder 102, whereby the cell selected based on the address is driven.

In the semiconductor device according to the invention, certain control data is inputted in data control circuit 112 through the means 1 for selecting test pattern input terminal, and the input buffer 3 and latch means 4 which are composed of the means 2 for generating physical pattern, and the control signal of the data control circuit 112 is inputted in the decoder 109, whereby various operations as able are implemented.

The semiconductor device and the testing method of the device of the invention adopt the technology as described above and so, physical pattern can be written without use of control by address as in the conventional ones in products that bit map is complicated such as process products using CPF type cells and in the wafer test or in the testing requiring bit compression.

Accordingly, according to the invention, accurate testing can be done by simple circuit modification without accompanied by any affect to the address signal.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A semiconductor device, comprising:
  memory cell array in which plural memory cells are arranged in a matrix, each of said memory cells being connected to bit and word lines;
  an input terminal to which a pattern signal is input when a compression test is conducted;
  input buffer means connected to said input terminal for outputting said pattern signal supplied from said input terminal to one of plural write data buses;
  a write circuit for writing said pattern signal data into said memory cells through said write data buses;
  first switches that selectively connect said one of plural write data buses to others of the plural write data buses; and
  a control unit for controlling said first switches in response to a compression test entry signal which starts the compression test.

2. The semiconductor device according to claim 1, wherein each of said write circuits is provided for each said bit line.

3. The semiconductor device according to claim 1, comprising at least three of said write data buses.

4. The semiconductor device according to claim 1, further comprising latch circuits between an output of said input buffer means and said write data buses, and wherein an output of each said latch circuits is connected to said write data buses via said first switches.

5. The semiconductor device according to claim 1, wherein an ON and OFF state of said first switches is controlled simultaneously by a first control signal, and said first control signal is generated by said control unit in response to said compression test entry signal.

6. The semiconductor device according to claim 1,
  wherein said first switches connect said one of plural write data buses to ones of said plural write data buses corresponding to a first polarity of said memory cells to output a first output signal;
  and further comprising,
    second switches that connect said one of plural write data buses to ones of said plural write data buses corresponding to a second polarity of said memory cells to output a second output signal having an opposite phase to said first output signal,
    third switches connected in parallel with each of said second switches to output a third output signal having a same phase as said first output signal, and
    a logic circuit unit for driving said first switches in response to the compression test entry signal, for driving said second switches in response to said compression test entry signal and a reverse signal of a physical test entry signal which determines a physical pattern, and for driving said third switches in response to said compression test entry signal and said physical test entry signal, and
  wherein said control unit controls said logic circuit unit in response to said compression test entry signal.

7. A semiconductor device, comprising:
  memory cell array in which plural memory cells are arranged in a matrix, each of said memory cells being connected to bit and word lines;
  a first input terminal to which a pattern signal is input when a compression test is conducted;
  second input terminals to which said pattern signal is not input when said compression test is conducted;
  a plurality of input buffer means connected to said first and second input terminals;
  write circuits for writing said pattern signal data into said memory cells through write data buses;
  first switches that connect write data buses corresponding to said input buffer means connected to said first input terminal to write data buses corresponding to a first polarity of said memory cells, to output a first output signal;
  second switches that selectively connect said write data buses corresponding to said input buffer means connected to said first input terminal to write data buses corresponding to a second polarity of said memory cells to output a second output signal having opposite phase to said first output signal;
  third switches connected in parallel with each of said second switches to output a third signal having a same phase as said first output signal;
  a logic circuit unit for driving said first switches in response to a compression test entry signal which starts said compression test, for driving said second switches in response to said compression test entry signal and a reverse signal of a buffer output signal of one of said input buffer means connected to said second input terminals, and for driving said third switches in response to said compression test entry signal and said buffer output signal; and a control unit for controlling said logic circuit unit in response to said compression test entry signal.

8. The semiconductor device according to claim 7, further comprising latch circuits between an output of said input buffer means and said write data buses, and wherein an output of each said latch circuits is connected to said write data buses via said first switches.

9. The semiconductor device according to claim 7, wherein an ON and OFF state of said first switches is controlled simultaneously by a first control signal, and said first control signal is generated by said control unit in response to said compression test entry signal.

10. A semiconductor device, comprising:

memory cell array in which plural memory cells are arranged in a matrix, each of said memory cells being connected to bit and word lines;

an input terminal to which a pattern signal is input when a compression test is conducted;

input buffer means connected to said input terminal for outputting said pattern signal supplied from said input terminal to one of plural write data buses;

write circuits for writing said pattern signal data into said memory cells through said write data buses;

switches for selectively connecting said one of said write data buses to other write data buses; and a control unit for controlling said switches to selectively and simultaneously apply signals to said write data buses, each of said signals having a same phase as or opposite phase to an output signal of said input buffer means, such that same data are stored in memory cells connected to said bit lines intersecting selected ones of said word lines.

11. The semiconductor device according to claim 10, wherein:

each of said write circuits is provided for each said bit line, said switches comprises first switches for outputting a first signal having same phase as said output signal of said input buffer means to said write data buses, and second switches for outputting a second signal having opposite phase to said output signal of said input buffer means to said write data buses, and said control circuit comprises a circuit for generating said second signal, and controls said first and second switches, to selectively and simultaneously apply said first signal or said second signal to said write data buses, such that same data are stored in memory cells connected to said bit lines intersecting selected word lines.

12. The semiconductor device according to claim 11, wherein:

each of said bit lines is composed of a pair of bit lines to process (complementary) data which has different polarity from each other, memory cell intersecting said selected word line is connected to one bit line of said pair of bit lines, and said control circuit controls said first switches to apply said first signal to said memory cell connected to said one bit line of said pair of bit lines, and controls second switches to apply said second signal to memory cell connected to another bit line of said pair of bit lines.

13. The semiconductor device according to claim 12, wherein an ON and OFF state of said first switches is controlled simultaneously by a first control signal, and said first control signal is generated by said control unit in response to said compression test entry signal.

14. The semiconductor device according to claim 12, further comprising latch circuits between an output of said input buffer means and said write data buses, and wherein an output of each said latch circuits is connected to said write data buses via said first switches.

15. A semiconductor device, comprising:

an array of plural memory cells;

plural input terminals arranged in a group, one of said plural input terminals being arranged and adapted to receive a compression test pattern signal;

a control unit that receives a compression test entry signal that starts a compression test;

plural latch circuits that are each connected to and receive signals from a respective one of said plural input terminals and that are controlled by said control unit in response to the compression test entry signal, outputs from said latch circuits being connected by respective write data buses to said memory cells; and plural switches that selectively connect the write data bus connected to one of said latch circuits that is connected to said one input terminal that receives the compression test pattern signal, to the write data buses connected to ones of said plural latch circuits that do not receive an output from said one input terminal, said plural switches being controlled by said control unit in response to the compression test entry signal.

16. A method of conducting a compression test on a semiconductor device having a memory cell array with plural memory cells arranged in a matrix, where the memory cells are connected to bit and word lines, the method comprising the steps of:

inputting a compression test pattern signal to one of plural input terminals of the device;

outputting the compression test pattern signal from an input buffer connected to the one of the plural input terminals to one of plural write data buses;

selectively connecting the one of the plural write data buses to others of the write data bases through first switches;

controlling the first switches in response to a compression test entry signal that starts the compression test; and writing data from the compression test pattern signal into the memory cells through the write data buses.

17. The method of claim 16, wherein the first switches connect the one of the plural write data buses to the others of the write data buses that correspond to ones of the memory cells having a first polarity to output a first output signal, and further comprising the steps of, connecting the one of the plural write data buses through second switches to others of the write data bases that correspond to ones of the memory cells having a second polarity opposite the first polarity to output a second output signal having a phase opposite a phase of the first output signal, connecting third switches in parallel to the second switches to output a third output signal having a phase the same as the phase of the first output signal, controlling the second switches in response to the compression test entry signal and to a reverse signal of a physical test entry signal that determines a physical pattern, and controlling the third switches in response to the compression test entry signal and to the reverse signal of the physical test entry signal.

18. A method of conducting a compression test on a semiconductor device having a memory cell array with plural memory cells arranged in a matrix, where the memory cells are connected to bit and word lines, the method comprising the steps of:

inputting a compression test pattern signal to one of plural input terminals of the device;

outputting the compression test pattern signal from an input buffer connected to the one of the plural input terminals to one of plural write data buses;

connecting the one of the plural write data buses to others of the write data bases through first switches, the first switches connecting the one of the plural write data buses to the others of the write data buses that correspond to ones of the memory cells having a first polarity to output a first output signal;

connecting the one of the plural write data buses through second switches to others of the write data bases that correspond to ones of the memory cells having a second polarity opposite the first polarity to output a second output signal having a phase opposite a phase of the first output signal, connecting third switches in parallel to the second switches to output a third output signal having a phase the same as the phase of the first output signal, controlling the first switches in response to a compression test entry signal that starts the compression test;

controlling the second switches in response to the compression test entry signal and to a reverse signal of a buffer output signal from one of said input buffers to which the compression test pattern signal is not input;

controlling the third switches in response to the compression test entry signal and to the reverse signal of the buffer output signal; and writing data into the memory cells through the write data buses.

19. A method of conducting a compression test on a semiconductor device having a memory cell array with plural memory cells arranged in a matrix, where the memory cells are connected to bit and word lines, the method comprising the steps of:

inputting a compression test pattern signal to one of plural input terminals of the device;

outputting the compression test pattern signal from a first input buffer connected to the one of the plural input terminals to one of plural write data buses;

selectively connecting the one of the plural write data buses to others of the write data bases through first switches;

controlling the first switches to selectively and simultaneously apply signals to selected ones of the write data buses, each of the signals having a phase the same as or opposite to a phase of a signal output from the first input buffer; and writing data into the memory cells through the write data buses.

* * * * *